United States Patent [19]

Kage et al.

[11] Patent Number: 4,810,101

[45] Date of Patent: Mar. 7, 1989

[54] NOISE DETECTION BY SAMPLING DIGITAL BASEBAND SIGNAL AT EYE OPENINGS

[75] Inventors: Kouzou Kage; Yoshiharu Tamura, both of Tokyo, Japan

[73] Assignee: NEC Corporation, Japan

[21] Appl. No.: 22,078

[22] Filed: Mar. 5, 1987

[30] Foreign Application Priority Data

Mar. 5, 1986 [JP] Japan .................................. 61-46415
Mar. 18, 1986 [JP] Japan .................................. 61-58304

[51] Int. Cl.⁴ .......................... H04B 1/12; H03K 5/08
[52] U.S. Cl. ........................................ 375/99; 375/97; 455/296
[58] Field of Search .................... 375/78, 80, 81, 95, 375/97, 99, 12; 455/208, 212, 222, 229, 296; 329/122; 328/63, 74

[56] References Cited

U.S. PATENT DOCUMENTS

| | | | |
|---|---|---|---|
| 3,697,875 | 10/1972 | Guanella | 375/12 |
| 4,071,827 | 1/1978 | Koike et al. | 375/12 |
| 4,416,017 | 11/1983 | Jasper et al. | 455/296 |

*Primary Examiner*—Benedict V. Safourek

*Assistant Examiner*—Marianne Huseman
*Attorney, Agent, or Firm*—Ostrolenk, Faber, Gerb & Soffen

[57] ABSTRACT

A noise detection circuit for a digital radio receiver comprises a sampling circuit for sampling a digital baseband signal having a noise component when an eye opening of the baseband signal is largest. A waveform generator is connected to the output of the sampling circuit for generating a waveform which is a replica of the baseband signal and free from the noise component. The waveform generator comprises a threshold comparator having decision thresholds and a waveform recovery circuit which includes a resistor, a plurality of storage capacitors of equal values and a switch responsive to the output of the threshold comparator for selectively coupling the output of the sampling circuit through the resistor to the storage capacitors. A substractor is connected to the outputs of the sampling circuit and the waveform generator for generating a signal representative of the noise component of the baseband signal. The output of the subtractor circuit can be used for various purposes including noise measurement, squelch action and automatic local oscillator frequency control.

22 Claims, 3 Drawing Sheets

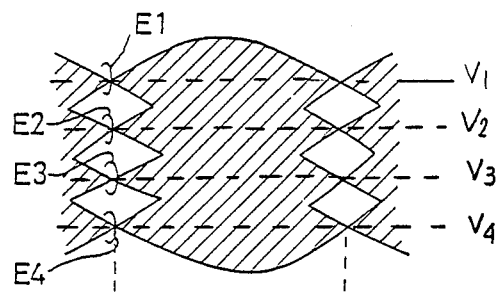
FIG. 2a
FIG. 2b
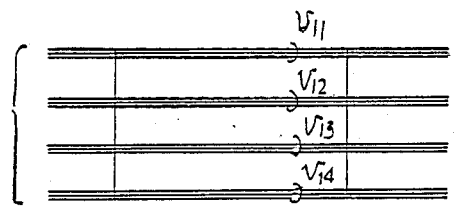
FIG. 2c  $X_1$
FIG. 2d  $D_1$
FIG. 2e  $D_2$
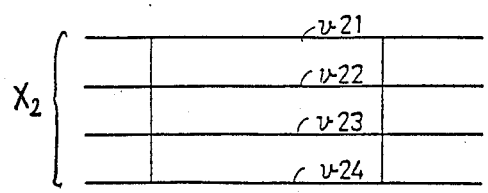
FIG. 2f  $X_2$
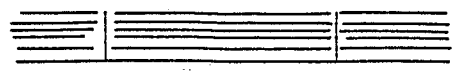
FIG. 2g  $X_3$

NOISE DETECTION BY SAMPLING DIGITAL BASEBAND SIGNAL AT EYE OPENINGS

BACKGROUND OF THE INVENTION

The present invention relates generally to digital radio communication and more specifically to a noise detection circuit for noise measurement and/or local oscillator frequency control.

In radio receivers, a noise detection circuit is provided for operating a squelch circuit to prevent production of unwanted signal. Such noise detection circuits are currently designed for detecting thermionic, or white noise from analog baseband signals. However, the prior art noise detection circuit is not suitable for detecting noise from digital baseband signals due to the fact that the quality of a digital baseband signal is not only determined by the white noise but by intersymbol interference which is primarily caused by phase variations during transmission. This is particularily acute when the signal is affected by noise impulses or interfered with unwanted signals.

SUMMARY OF THE INVENTION

It is therefore an object of the present invention to provide a noise detection circuit which provides an accurate measure of the quality of a received digital baseband signal. The noise detection circuit of the invention is also useful for controlling the frequency of a local oscillator to effectively suppress time-axis jitter.

Specifically, the noise detection circuit of the present invention comprises a sampling circuit for sampling a baseband signal having a noise component when an eye opening of the baseband signal is largest, and a waveform generator connected to the output of the sampling circuit for generating a waveform which is a replica of the baseband signal and free from the noise component. A subtractor circuit is connected to the outputs of the sampling circuit and the waveform generator for generating a signal representative of the noise component of the baseband signal. The output of the subtractor circuit can be used for various purposes including noise measurement, squelch action and automatic local oscillator frequency control.

Preferably, the waveform generator comprises a threshold comparator connected to the output of the sampling circuit, the threshold comparator having a plurality of decision thresholds corresponding respectively to significant levels of the baseband signal for generating an output signal when a signal at the output of the sampling means exceeds each one of the decision thresholds, and waveform recovery means connected to the outputs of the sampling circuit and the threshold comparator for converting a signal supplied from the sampling circuit into a signal representative of a relica of the baseband signal free from the noise component in response to the output signal of the threshold comparator.

BRIEF DESCRIPTION OF THE DRAWINGS

The present invention will be described in further detail with reference to the accompanying drawings, in which:

FIGS. 2a to 2g are illustrations of eye pattern waveforms appearing in the diagram of FIG. 1.

DETAILED DESCRIPTION

Figure 1:
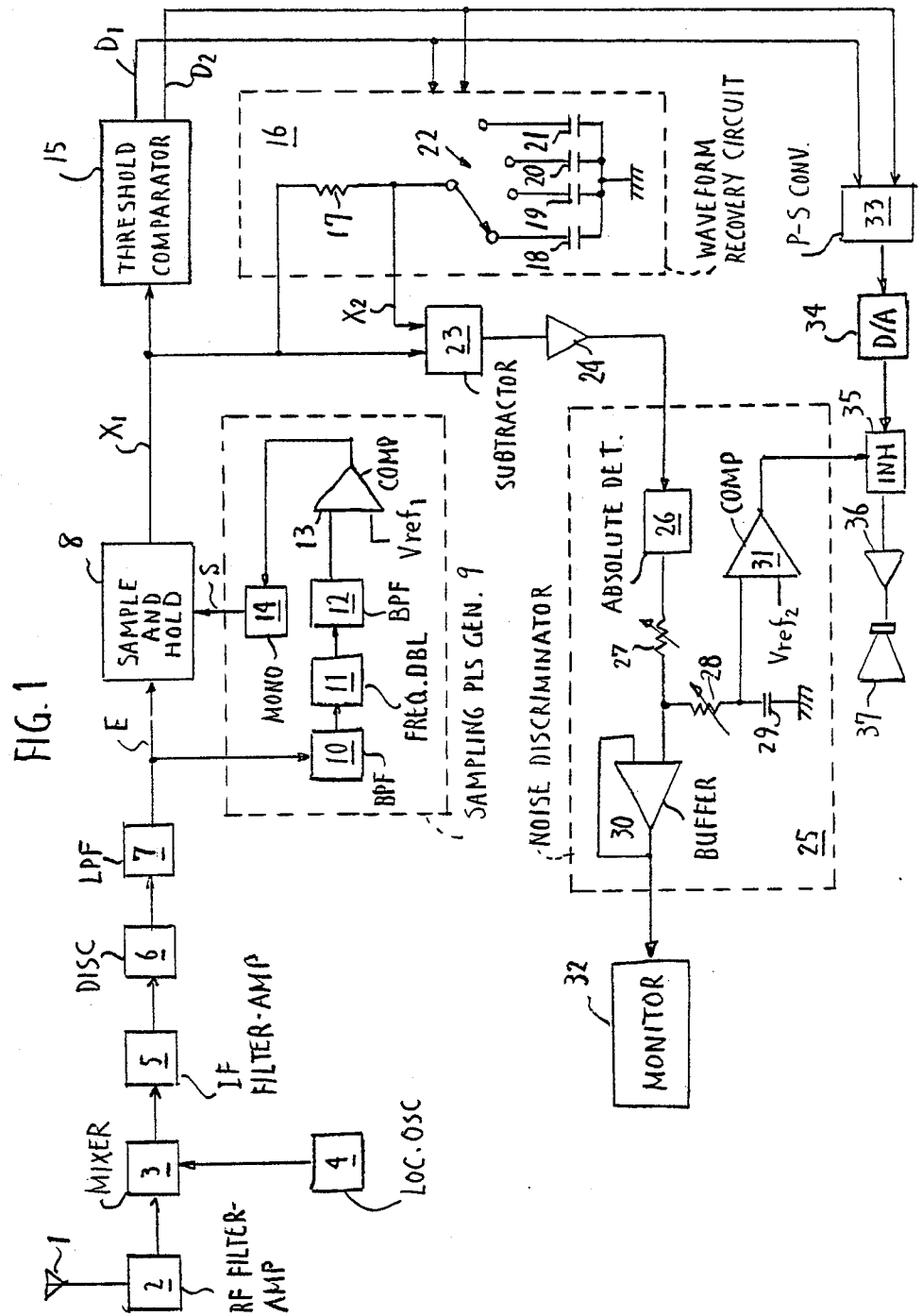
FIG. 1 is a block diagram of a radio receiver according to a first embodiment of the present invention.

Referring to FIG. 1, there is shown a digital radio receiver including a noise detection circuit of the present invention. The radio receiver is adapted to receive a radio-frequency signal from a transmitter station in which the original baseband signal is a binary digital signal which is frequency modulated upon plural carriers having four different frequencies or phase modulated upon a single carrier into a quarternary phase shift keying (PSK) signal. For purposes of error rate reduction, the baseband signal is converted to an error-immune coded format prior to the modulation in a manner well known in the art. The radio receiver includes the antenna 1 which intercepts the RF signal and drives a radio-frequency filter/amplifier 2 whose output is connected to an input of a mixer 3 to which the output of a local oscillator 4 is also applied. The output of mixer 3 drives an intermediate frequency filter/amplifier 5, which in turn drives a discriminator, or angular demodulator 6 to generate a signal as a replica of the original baseband signal. For purposes of disclosure, it is assumed that the transmitted signal is frequency modulated, and so the angular demodulator is a frequency demodulator. The modulated baseband signal is applied through a Nyquist lowpass filter 7 to produce a waveform E which is applied to a sample-and-hold circuit 8 and a sampling pulse generator 9.

Sampling pulse generator 9 is formed by a bandpass filter 10, a frequency doubler 11 and a bandpass filter 12. Bandpass filter 10 has a center frequency corresponding to one half of the symbol rate of the received signal and bandpass filter 12 has a center frequency corresponding to the symbol rate. The frequency of the output of the bandpass filter 10 is doubled by frequency doubler 11 and passed through the bandpass filter 12 to a comparator 13 for comparison with a reference voltage $V_{ref_1}$. When this reference voltage is reached, the comparator 13 drives a monostable multivibrator 14 to produce a narrow sampling pulse S. As illustrated in FIG. 2a, the four-level digital signal has an eye pattern having eye openings formed by waveforms $E_1$, $E_2$, $E_3$ and $E_4$ of the received signal E. As is well known in the art, the eye pattern is a trace of the bit stream on an oscilloscope which is set to trigger on the bit rate with a sweep duration of a unit bit interval, and the eye openings decrease with additive noise and bandwidth limitations. The best time to sample the received signal is when the eye openings are largest. Sampling pulse S (FIG. 2b) is generated so that it coincides with the timing at which the eye openings are largest. Sample-and-hold 8 responds to the sampling pulse by sampling and holding the input waveform E to produce an output signal $X_1$ which forms an eye pattern as shown in FIG. 2c. As indicated, the sampled signal $X_1$ assumes one of four voltage levels v11, v12, v13 and v14 which correspond respectively to the waveforms $E_1$, $E_2$, $E_3$ and $E_4$. If the received signal is contaminated with noise, the sampled voltages appear as closely spaced parallel horizontal lines.

The output signal $X_1$ of sample-and-hold 8 is applied to a threshold comparator 15. Threshold comparator 15 essentially comprises four comparators having decision thesholds $V_1$, $V_2$, $V_3$ and $V_4$ corresponding respectively to the crossover points of the waveforms $E_1$, $E_2$, $E_3$ and $E_4$ when the center frequency of the output of mixer 3 is aligned with the center frequency of the IF filter/amplifier 5. Each comparator generates an output signal when the input waveform exceeds its decision threshold. The outputs of the comparators are connected to a logic circuit to convert them into a pair of binary signals $D_1$ and $D_2$ such that they assume one of combinations (1, 1), (1, 0), (0, 1) and (0, 0) corresponding to the reference voltages $V_1$, $V_2$, $V_3$ and $V_4$, respectively. FIGS. 2d and 2e illustrate the eye patterns of the binary signals $D_1$ and $D_2$, respectively.

The binary outputs of threshold comparator 15 drive a waveform recovery circuit 16 which comprises a resistor 17 connected at one end to the output of sample-and-hold 8, and a plurality of storage capacitors 18, 19, 20 and 21 of equal capacitance values. Each of the capacitors 18 to 21 has one end coupled to ground and the other end coupled respectively to terminals of a high speed electronic switch 22 which may be implemented by semiconductor analog gates. Electronic switch 22 is responsive to the binary signals $D_1$ and $D_2$ to selectively establish a switched connection between resistor 17 and a selected one of the storage capacitors 18 to 21 so that these capacitors respectively store charge packets of the sampled voltages $v_{11}$, $v_{12}$, $v_{13}$ and $v_{14}$. Resistor 17 and each of the switched capacitors 18 to 21 provide a time constant which is much greater than the time interval between successive symbols of the received signal. The storage capacitors 18, 19, 20 and 21 build up charges which result in voltages $v_{21}$, $v_{22}$, $v_{23}$ and $v_{24}$, respectively. By virtue of the random occurrence of noise, voltages $v_{21}$, $v_{22}$, $v_{23}$ and $v_{24}$ represent average values of voltages $v_{11}$, $v_{12}$, $v_{13}$ and $v_{14}$, respectively, over time. Therefore, the eye pattern of a combined voltage $X_2$ developed across the storage capacitors appears as single horizontal lines corresponding to voltages $v_{21}$, $v_{22}$, $v_{23}$ and $v_{24}$ as indicated in FIG. 2f. As a result, the signal $X_2$ can be considered as a replica of the original four-level digital signal and the signal $X_1$ will have the same waveform as the signal $X_2$ if there is no noise in the received signal. In addition, since the size of eye openings differs from one system to another due to manufacturing tolerances including transmission and reception modulation indices and frequencies of the transmitted carrier and receiver's local oscillator, the averaging effect of the waveform recovery circuit 16 allows the output signal $X_2$ to assume a uniform value independent of the manufacturing tolerances.

Signals $X_1$ and $X_2$ are applied to a subtractor 23 to extract the noise from the signal $X_1$. As mentioned above, the output of waveform recovery circuit 16 contains no undesirable random factors caused by systems's tolerances, and therefore the output of subtractor 23 is a true representation of noise including white noise and a noise impulse introduced from external sources. A further advantage of the eye pattern sampling and switched capacitor storage technique of the invention is that it allows simplification of circuitry.

The extracted noise is amplified by an amplifier 24 and so the eye pattern of the amplified noise appears as indicated by a waveform $X_3$ in FIG. 2g. The output of amplifier 24 is applied to a noise discriminator 25 which comprises an absolute detector 26 to detect the absolute value of the noise. The output of absolute detector 26 is coupled by a variable resistor 27 and a buffer amplifier 30 to a monitor circuit 32 on the one hand and coupled by a series circuit including a variable resistor 28 and a capacitor 29 to ground on the other. A circuit node between variable resistor 28 and capacitor 29 is connected to a comparator 31 which compares the voltage at the circuit node with a reference voltage $Vref_2$. Comparator 31 generates a squelch signal when the voltage at the circuit node exceeds the reference voltage $Vref_2$.

If resistor 27 is adjusted to a value much lower than that of resistor 28, the output of buffer amplifier 30 represents the instantaneous value of the noise more accurately than the average value of the noise. Whereas, if resistor 27 is adjusted to a value much higher than that of resistor 28, the output of buffer amplifier 30 represents the average value of the noise more accurately than the instantaneous value. If variable resistors 27 and 28 are adjusted equal to each other, the buffer amplifier 30 produces a high voltage DC output when the field strength of the received signal is low and produces an impulsive output when a noise impulse is introduced to the signal.

The binary outputs of threshold comparator 15 are further applied to a parallel-to-serial converter 33 where the parallel outputs $D_1$ and $D_2$ are converted to a sequence of binary signals and applied to a digital-to-analog converter 34. A replica of the original analog signal is thus obtained by the D/A converter 34. The output of D/A converter 34 is applied to an inhibit gate 35 to the control terminal of which is connected the output terminal of comparator 31 to prevent the application of the output of D/A converter 34 via power amplifier 36 to a loudspeaker 37 when the comparator 31 produces a squelch signal.

Frequency or phase jitter of the received signal is another source of noise since it is translated by the discriminator 6 into undesired amplitude variations. Since the four-level digital signal which is the baseband signal containing a DC component is cancelled by subtractor 23, the output of subtractor 23 can be utilized to control the frequency of the local oscillator to compensate for such time-axis jitter. The advantage of this frequency control resides in the elimination of the need to employ a lowpass filter which would be required to reject the DC-containing baseband signal if the frequency control signal is to be derived directly from the discriminator 6. Otherwise, such a lowpass filter would form part of a negative feedback loop and introduce a substantial amount of delay into the closed loop, which makes it unsuitable for a radio receiver which is adapted to receive an RF signal whose baseband is a digital signal.

Figure 3:
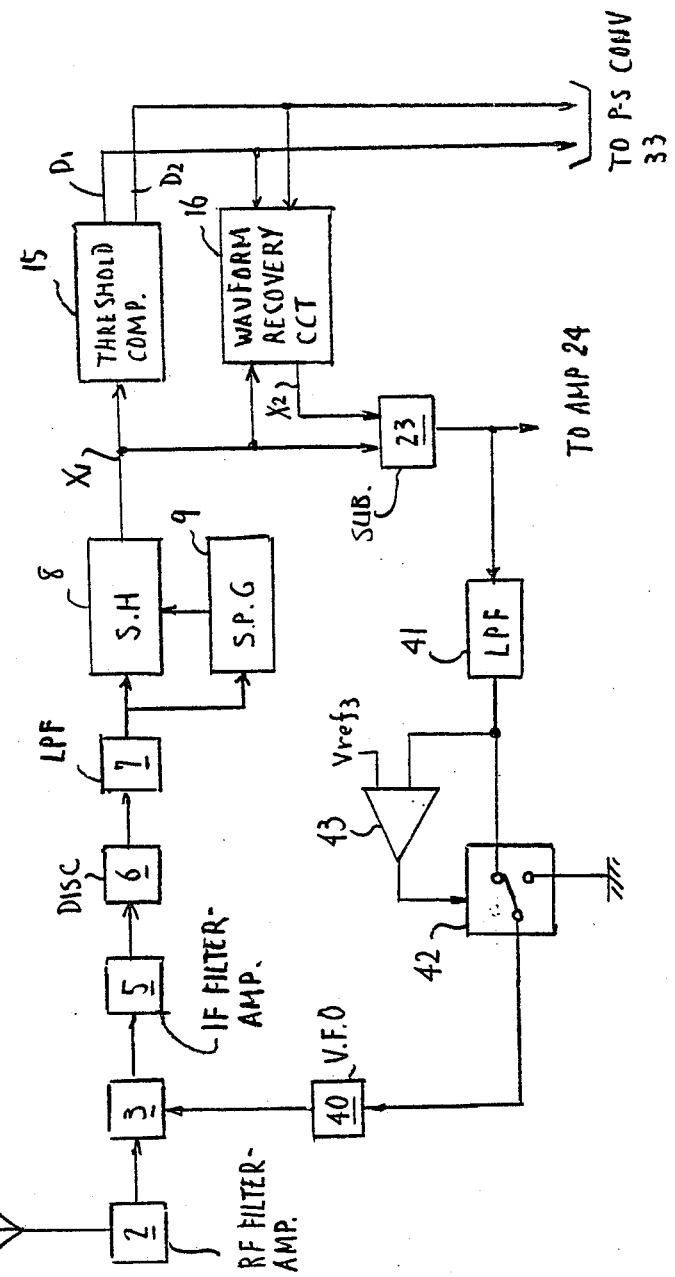
FIG. 3 is a block diagram of a radio receiver according to a second embodiment of the present invention.

FIG. 3 is an illustration of a radio receiver which includes a variable frequency local oscillator 40. In FIG. 3, elements corresponding to those in FIG. 1 are identified by the same numerals as used in FIG. 1. The output of subtractor 23 is applied to a lowpass filter 41 to smooth the noise extracted by subtractor 23 into a DC voltage, which is applied through a switch 42 to the control terminal of local oscillator 40. A negative feedback loop is therefore formed in the receiver to compensate for time-axis jitter which may occur in the input signal of the discriminator 6. If the communication is interrupted and a no-signal condition exists, a large amplitude voltage would develop at the output of subtractor 23 and affect the local oscillator 40 to such an extent that it remains unstable for a certain period of time following the resumption of communication. For this reason, the output of lowpass filter 41 is applied to a comparator 43 for comparison with a reference voltage $Vref_3$ which represents a no-signal condition. Comparator 43 generates an output when the output of lowpass filter 41 exceeds the reference. To stabilize the local oscillator 40, the comparator output is coupled to the control terminal of switch 42 to apply a reference, or ground potential to the control input of local oscillator 40, instead of the output of lowpass filter 41.

The foregoing description shows only preferred embodiments of the present invention. Various modifications will become apparent to those skilled in the art without departing from the scope of the present invention, which is only limited by the appended claims.

What is claimed is:

1. A noise detection circuit comprising:
    means for detecting an eye opening of a digital baseband signal having a noise component and generating a sampling pulse when said eye opening is largest;
    sampling means for sampling said baseband signal in response to said sampling pulse;
    waveform generating means connected to the output of said sampling means for detecting multilevels of the sampled signal to remove said noise component from the sampled signal and generating therefrom a waveform which is a replica of an original version of said baseband signal; and
    subtractor means connected to the output of said sampling means and said waveform generating means for generating a signal representative of said noise component.

2. A noise detection circuit as claimed in claim 1, wherein said waveform generating means comprises:
    threshold comparator means connected to the output of said sampling means, said threshold comparator means having a plurality of decision thresholds corresponding respectively to significant levels of said baseband signal for generating an output signal when a signal at the output of said sampling means exceeds each one of said decision thresholds; and
    waveform recovery means connected to the outputs of said sampling means and said threshold comparator means for converting a signal supplied from said sampling means into a signal representative of said relica of said baseband signal free from said noise component in response to the output signal of said threshold comparator means.

3. A noise detection circuit as claimed in claim 2, wherein said waveform recovery means comprises:
    a resistor connected at one end to the output of said sampling means;
    a plurality of storage capacitors of equal capacitance values associated respectively with said decision thresholds; and
    switch means for providing a switched connection between the other end of said resistor and an associated one of said storage capacitors in response to the output signal of said threshold comparator means to develop voltages in said storage capacitors.

4. A noise detection circuit as claimed in claim 1, further comprising:
    a first resistor coupled at one end thereof to the output of said subtractor means;
    a second resistor connected at one end thereof to the other end of said first resistor;
    a capacitor connected between the other end of said second resistor and ground; and
    a buffer amplifier connected to a circuit node between said first and second resistors.

5. A noise detection circuit as claimed in claim 4, wherein each of said first and second resistors comprises a variable resistor.

6. A receiver adapted to receive an angular modulated signal, comprising:
    mixer means for converting said signal to an intermediate frequency (IF) signal;
    variable frequency oscillator means for supplying a variable frequency carrier to said mixer means in response to a control signal applied thereto;
    angular demodulator means connected to the output of said mixer means for demodulating the IF signal;
    sampling means connected to the output of said demodulator means for sampling the demodulated signal when an eye opening of the demodulated signal is largest and producing a sampled signal which may contain a noise component;
    waveform generating means connected to the output of said sampling means for deriving from said sampled signal a waveform which corresponds to a baseband signal of said angular modulated signal and free from said noise component; and
    subtractor means connected to the outputs of said sampling means and said waveform generating means for generating a signal representative of said noise component and supplying the noise representative signal to said variable frequency oscillator means as said control signal.

7. A receiver as claimed in claim 6, further comprising:
    signal absence detecting means for detecting when said angular modulated signal is not present; and
    inhibit means for inhibiting application of said noise representative signal to said variable frequency oscillator in response to an output signal from said signal absence detecting means.

8. A receiver as claimed in claim 6, wherein said waveform generating means comprises:
    threshold comparator means connected to the output of said sampling means, said threshold comparator means having a plurality of decision thresholds corresponding respectively to significant levels of said baseband signal for generating an output signal when said sampled signal exceeds each one of said decision thresholds; and
    waveform recovery means connected to the outputs of said sampling means and said threshold comparator means for converting a signal supplied from said sampling means into a signal representative of a replica of said baseband signal free from said noise component in response to the output signal of said threshold comparator means.

9. A receiver as claimed in claim 8, wherein said waveform recovery means comprises:
    a resistor connected at one end to the output of said sampling means;
    a plurality of storage capacitors of equal capacitance values associated respectively with said decision thresholds; and
    switch means for providing a switched connection between the other end of said resistor and an associated one of said storage capacitors in response to the output signal of said threshold comparator means to develop voltages in said storage capacitors.

10. A receiver as claimed in claim 8, further comprising:

utilization circuit means connected to the output of said threshold comparator means; and squelch circuit means for comparing an output voltage from said subtractor means with a voltage reference to generate a squelch signal when the voltage exceeds the reference to prevent said utilization circuit means from producing an output signal.

11. A receiver as claimed in claim 6, further comprising:
   a first resistor coupled at one end thereof to the output of said subtractor means;
   a second resistor connected at one end thereof to the other end of said first resistor;
   a capacitor connected between the other end of said second resistor and ground; and
   a buffer amplifier connected to a circuit node between said first and second resistors.

12. A receiver as claimed in claim 11, wherein each of said first and second resistors comprises a variable resistor.

13. A receiver adapted to receive an angular modulated signal, comprising:
   frequency converting means for converting said angular modulated signal to an intermediate frequency (IF) signal;
   angular demodulator means for demodulating said IF signal;
   utilization circuit means connected to be responsive to said demodulated IF signal;
   sampling means connected to the output of said demodulator means for sampling the demodulated signal when an eye opening of the demodulated signal is largest and producing a sampled signal which may contain a noise component;
   waveform generating means connected to the output of said sampling means for deriving from said sampled signal a waveform which corresponds to a baseband signal of said angular modulated signal and free from said noise component;
   subtractor means connected to the outputs of said sampling means and said waveform generating means for generating a signal representative of said noise component; and
   squelch circuit means responsive to said noise representative signal for preventing said utilization circuit means from producing an output signal when said noise representative signal exceeds a predetermined value 14. A receiver as claimed in claim 13, wherein said waveform generating means comprises:
   threshold comparator means connected to the output of said sampling means, said threshold comparator means having a plurality of decision thresholds corresponding respectively to significant levels of said baseband signal for generating an output signal when said sampled signal exceeds each one of said decision thresholds; and
   waveform recovery means connected to the outputs of said sampling means and said threshold comparator means for converting a signal supplied from said sampling means into a signal representative of a replica of said baseband signal free from said noise component in response to the output signal of said threshold comparator means.

15. A receiver as claimed in claim 14, wherein said utilization circuit means is connected to the output of said threshold comparator means.

16. A receiver as claimed in claim 15, wherein said waveform recovery means comprises:
   a resistor connected at one end to the output of said sampling means;
   a plurality of storage capacitors of equal capacitance values associated respectively with said decision thresholds; and
   switch means for providing a switched connection between the other end of said resistor and an associated one of said storage capacitors in response to the output signal of said threshold comparator means to develop voltages in said storage capacitors.

17. A receiver as claimed in claim 13, further comprising:
   a first resistor coupled at one end thereof to the output of said subtractor means;
   a second resistor connected at one end thereof to the other end of said first resistor;
   a capacitor connected between the other end of said second resistor and ground; and
   a buffer amplifier connected to a circuit node between said first and second resistors.

18. A receiver as claimed in claim 17, wherein each of said first and second resistors comprises a variable resistor.

19. A noise detection circuit comprising:
   sampling means for sampling a baseband signal having a noise component when an eye opening of said baseband signal is largest;
   waveform generating means connected to the output of said sampling means for generating therefrom a waveform which is a replica of said baseband signal and free from said noise component, said waveform generating means comprising:
      (i) threshold comparator means connected to the output of said sampling means, said threshold comparator means having a plurality of decision thresholds corresponding respectively to significant levels of said baseband signal for generating an output signal when a signal at the output of said sampling means exceeds each one of said decision thresholds; and
      (ii) waveform recovery means connected to the outputs of said sampling means and said threshold comparator means for converting a signal supplied from said sampling means into a signal representative of said replica of said baseband signal free from said noise component in response to the output signal of said threshold comparator means; and
   subtractor means connected to the outputs of said sampling means and said waveform generating means for generating a signal representative of said noise component of said baseband signal.

20. A noise detection circuit as claimed in claim 19, wherein said waveform recovery means comprises:
   a resistor connected at one end to the output of said sampling means;
   a plurality of storage capacitors of equal capacitance values associated respectively with said decision thresholds; and
   switch means for providing a switched connection between the other end of said resistor and an associated one of said storage capacitors in response to the output signal of said threshold comparator means to develop voltages in said storage capacitors.

21. A noise detection circuit comprising:

sampling means for sampling a baseband signal having a noise component when an eye opening of said baseband signal is largest;

waveform generating means connected to the output of said sampling means for generating therefrom a waveform which is a replica of said baseband signal and free from said noise component;

subtractor means connected to the outputs of said sampling means and said waveform generating means for generating a signal representative of said noise component of said baseband signal;

a first resistor coupled at one end thereof to the output of said subtractor means;

a second resistor connected at one end thereof to the other end of said first resistor;

a capacitor connected between the other end of said second resistor and ground; and a buffer amplifier connected to a circuit node between said first and second resistors.

22. A noise detection circuit as claimed in claim 21, wherein each of said first and second resistors comprises a variable resistor.

* * * * *